United States Patent [19]
Botti et al.

[11] Patent Number: 5,585,752
[45] Date of Patent: Dec. 17, 1996

[54] FULLY INTEGRATED, RAMP GENERATOR WITH RELATIVELY LONG TIME CONSTANT

[75] Inventors: Edoardo Botti, Vigevano; Giorgio Chiozzi, Cinisello Balsamo, both of Italy

[73] Assignee: SGS-Thomson Microelectronics, S.r.l., Agrate Brianza, Italy

[21] Appl. No.: 413,721

[22] Filed: Mar. 29, 1995

[30] Foreign Application Priority Data

Mar. 29, 1994 [EP] European Pat. Off. ............. 94830149

[51] Int. Cl.$^6$ ...................................................... H03K 4/06
[52] U.S. Cl. ...................... 327/131; 327/132; 327/134; 327/136; 327/140
[58] Field of Search .................... 327/552, 335, 327/264, 268, 131, 132, 134, 136, 140

[56] References Cited

U.S. PATENT DOCUMENTS

| | | | |
|---|---|---|---|
| 3,911,296 | 10/1975 | Davis | 307/297 |
| 5,126,689 | 6/1992 | Nakamura | 330/296 |
| 5,276,358 | 1/1994 | Carvajal | 327/134 |

FOREIGN PATENT DOCUMENTS

| | | |
|---|---|---|
| 0580920 | 2/1994 | European Pat. Off. . |
| 8102819 | 3/1980 | WIPO . |

OTHER PUBLICATIONS

"Inexpensive triggered–sweep generator updates recurring–sweep scopes" Woodward *Electronic Design 23* Nov. 8, 1976 p. 72.

"Programmable Function Generator" Bigbie et al. IBM Tech Disc. Bul. vol. 20, No. 7 Dec. 1977 pp. 2531–2533.

Hart, "Sawtooth–voltage–waveform generator for extended––duration sweeps." Electronics Letters, vol. 11, No. 3, Feb. 1975, pp. 64–65.

Patent Abstracts of Japan, vol. 9, No. 257 (P–396) 15 Oct. 1985, and JP–A–60 107 185 (Sony KK) 12 Jun. 1985.

Blaesner, "Schaltnetzteile: schneller und sicherer," Elektronik, vol. 38, No. 4, Feb. 1989, Munchen de, pp. 57–64.

*Primary Examiner*—Margaret Rose Wambach
*Attorney, Agent, or Firm*—Robert Groover; Betty Formby

[57] ABSTRACT

A circuit for dividing a reference current is composed of a number n of transistors connected in cascade, in a Darlington configuration, between current generator and a fractionary current output node and by N+k (where k is an integer different from zero) directly biased diodes in series, connected between the generator and the fractionary current output node. The circuit does not employ current mirrors, so all transistors may have the minimum size, which also minimizes the effects of leakage currents. Additionally, compensation elements may be used for compensating the leakage currents from the base regions of the transistors. The circuit is useful as a capacitance multiplier, or as a slow ramp generator in a large number of design situations. Independence from intrinsic parameters of the transistors used and/or from temperature of operation may be provided by employing a specifically designed reference current generator. Several embodiments are described.

32 Claims, 2 Drawing Sheets

14
FULLY INTEGRATED, RAMP GENERATOR WITH RELATIVELY LONG TIME CONSTANT

CROSS-REFERENCE TO RELATED APPLICATION

This application claims priority from EP 94830149.4, filed Mar. 29, 1994, which is hereby incorporated by reference. However, the content of the present application is not necessarily identical to that of the priority application.

BACKGROUND AND SUMMARY OF THE INVENTION

The present invention relates to an integrated capacitance multiplier circuit, and specifically to a ramp generator with a relatively long time constant that may be entirely integrated in a monolithic form. The circuit is able to provide a time constant in the order of several hundreds milliseconds, without requiring large capacitances that would be difficult to integrate and is useful in a large number of applications.

An ever increasing number of functions that are implemented in an integrated circuit (with the consequent limitation of the number of pins available)has led to the development of circuits that require a minimum number of externally connected components.

Notably parameters or functions that may be entirely integrated with increasing difficulty are relatively large time constants, for example on the order of several hundreds of milliseconds, which normally entail the use of large capacitances that are hardly integratable.

So-called capacitance multiplier circuits that can be fully integrated have been known for a long time. They commonly employ an operational amplifier, capable of controlling the charge current, necessarily of an extremely small value, of an integrated capacitor. A capacitance multiplier circuit, having improved characteristics of precision and thermal drift, is described in the European patent application No. 92830419.5, filed on Jul. 28, 1992, by the instant Applicant.

Capacitance multiplier circuits based on an operational amplifier are relatively complex and require a non-negligible area of integration.

A similar function may also be implemented by employing a simple constant current generator and a circuit capable of dividing the current by a factor in the order of thousands. Such circuits may be implemented by employing a plurality of cascaded current dividers, realized by current mirrors employing transistors of different size. A circuit of this kind, capable of achieving a ramp slope of about 100 V/sec with an integrated capacitance (C) of 10 pF, employing an easily integratable current generator capable of delivering a current of about 10 µA, is shown in FIG. 1.

In the reported example, it is necessary to divide the current Ir by a factor equal to 10,000. As shown in FIG. 1, the circuit may employ four cascaded current mirrors (current dividers), each dividing the current by 10.

A circuit of this type, is less burdensome than a capacitance multiplier based on the use of an operational amplifier, but still requires a non-negligible area of integration and the leakage currents of the tubs (corresponding to the base region of a transistor) within which the large size transistors are found and the substrate of the integrated circuit may assume a value that is comparable with the current $I_2$ (of about 1 nA) that must be delivered to the integrated capacitance C. At high temperature, the capacitance C may not charge at all.

Also an equivalent circuit of that depicted in FIG. 1, but implemented with NPN transistors instead than with PNP transistors would not provide any significant improvement.

The main aim of the present invention is to provide a ramp generator or a capacitance multiplier that can be fully integrated in a monolithic form while employing a reduced number of transistors that may have the minimum process size.

It is a further object of invention to provide as low ramp generator or capacitance multiplier having reduced area requirements and provided with means for compensating the leakage current of the tubs wherein the transistors that compose the circuit are formed, in order to ensure reliability of the circuit also at a high temperature of operation.

Basically, the circuit of the invention rests on the principle of employing the voltage drop across a number N of directly biased junctions for biasing a number N+k of junctions, where k an integer different from 0, and employing the current flowing through said N+k junctions for charging an integrated capacitance. The N, directly biased junctions are realized by an N number of transistors connected in cascade in a Darlington configuration, functionally connected between a reference current generator and a capacitor to be charged through a series of N+k diodes (junctions). The diodes are directly biased and functionally connected between the same reference current generator and the capacitor, schematically in a parallel arrangement with the cascaded Darlington configured transistors.

All transistors and diodes (or diode configured transistors) may have the minimum size that is allowed by the fabrication process of the integrated circuit.

It may be shown that the charge current of the integrated capacitance, which flows through the series of diodes, is inversely proportional by a factor given by the current transfer ratio ($h_{FE}$) of the N transistors used, in a common-emitter configuration, elevated at a power given by the ratio N/N+k ($h_{FE}^{N/N+k}$).

Using an integrated capacitance of about 10 pF, ramp slopes of about 100 V/sec may be easily achieved with only three, Darlington configured cascaded transistors and four diodes (diode-configured transistors). The charge current of the integrated capacitance that flows through the four diodes is given, in first approximation, by the product of the current generated by the current generator, elevated at a power ¾, with the saturation current (Is) of the transistors used at a power of ¼, divided by $h_{FE}^{3/4}$, that is:

$$I_2 = I_r = \frac{I_r^{\frac{3}{4}} I_s^{\frac{1}{4}}}{h_{FE}^{\frac{3}{4}}}$$

The circuit of the invention may also be implemented in different ways, for example in a way suitable to untie the value of the charge current from the $h_{FE}$ parameter of the transistors used and/or compensate for non-negligible leakage currents, at a high temperature of operation.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
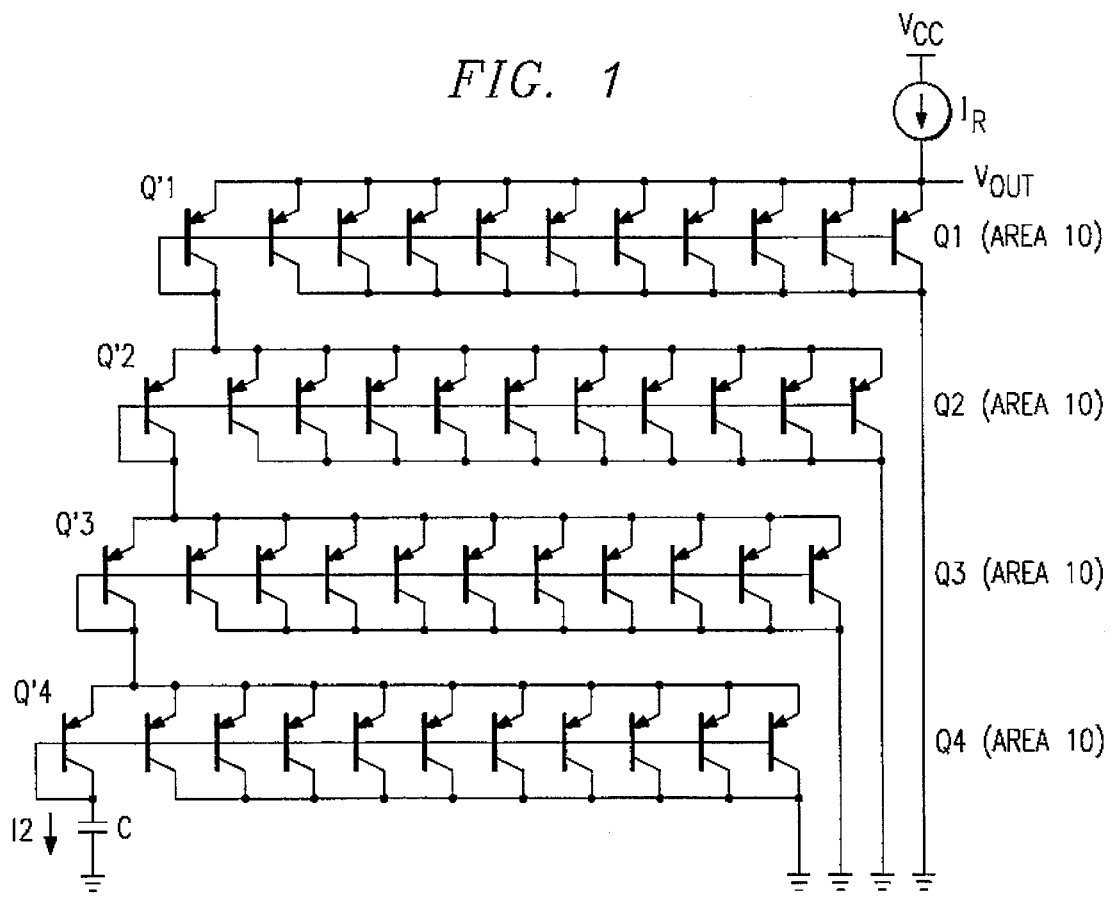
FIG. 1 shows an integrated capacitance multiplier that may be employed as a ramp generator with a relatively large time constant, according to a known practice, as described above.
Figure 2:
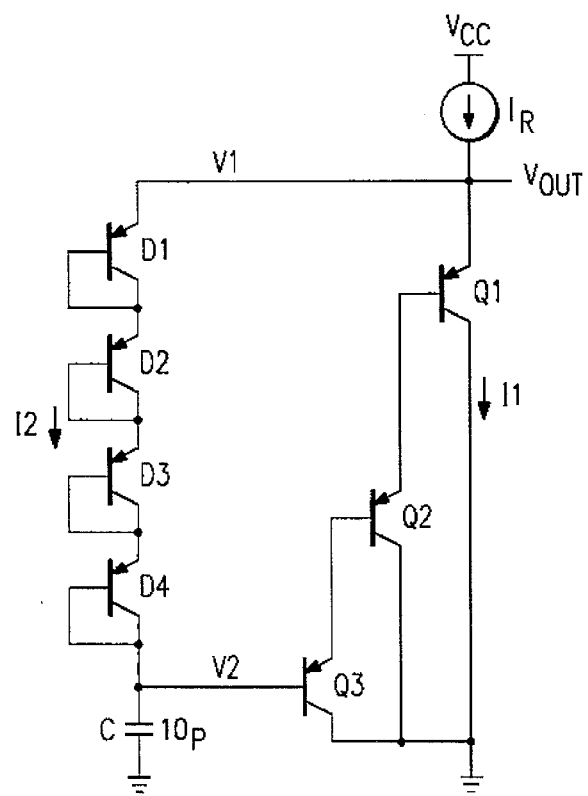
FIG. 2 shows a circuit according to the present invention which is functionally equivalent to the circuit of FIG. 1.

The numerous innovative teachings of the present application will be described with particular reference to the presently preferred embodiment (by way of example, and not of limitation), in which:

FIG. 2 shows an integrated capacitance multiplier circuit that can be used as a ramp generator with a relatively large time constant, made according to the present invention.

According to this first embodiment, the circuit employs three bipolar PNP transistors (Q1, Q2 and Q3), connected in cascade, in a Darlington configuration (common emitter).

The base of Q3 is connected to the integrated capacitor C, the emitter of Q1 is connected to a reference current generator Ir, while the collectors of the transistors are connected in common to a common ground potential.

Four diodes (PN junctions), D1, D2, D3 and D4, are directly biased and are connected in series between the reference current generator Ir and the integrated capacitance C.

Consistently with the general requirements of minimizing the integration area, all the transistors used: Q1, Q2 and Q3, as well as the four diode configured transistors: D1, D2, D3 and D4, may advantageously have the same minimum dimensions that are permitted by the fabrication process of the integrated circuit.

The voltage drop across the three directly biased PN junctions (emitter-base junctions) of the transistors Q1, Q2, Q3, that is V1–V2, determines the biasing of the four PN junctions, that is of the diodes D1, D2, D3 and D4, thus controlling the current $I_2$ that flows through the diode chain D1 ... D4, and which charges the integrated capacitance C (neglecting the contribution of the base current of the transistor Q3).

By analyzing the circuit one may write:

$$V_1 - V_2 = V_t \ln\left(\frac{I_1}{I_s}\right) + V_t \ln\left(\frac{I_1}{\beta_1 I_s}\right) + V_t \ln\left(\frac{I_1}{\beta_1 \beta_2 I_s}\right) \quad (1)$$

where $V_t$ represents the so-called "thermal voltage" (equivalent to KT/q), $I_s$ represents the saturation current of the transistors, $\beta_1$ and $\beta_2$ the current gains of Q1 and Q2, respectively (in a common emitter configuration).

From the equation (1) one obtains:

$$V_1 - V_2 = V_t \ln\left(\frac{I_1^3}{\beta_1^2 \beta_2 I_s^3}\right) \quad (2)$$

Therefore, it is possible to derive the current $I_2$ that flows through the four diodes in series:

$$I_2 = I_s \left\{ \exp\left[\frac{1}{4} \ln\left(\frac{I_1^3}{\beta_1^2 \beta_2 I_s^3}\right)\right] + 1 \right\} \quad (3)$$

Bringing the term ¼ to exponent, neglecting unity and simplifying, the equation (3) may be simplified as follows:

$$I_2 = I_s \sqrt[4]{\frac{I_1^3}{\beta_1^2 \beta_2 I_s^3}} \quad (4)$$

that is:

In practicing the invention with a common fabrication process, $$I_2 = \frac{I_1^{\frac{3}{4}} I_s^{\frac{1}{4}}}{\beta_1^{\frac{1}{2}} \beta_2^{\frac{1}{4}}} \quad (5)$$

the decoupling transistor Q1 may be a PNP transistor of minimum area, as allowed by the process, for example of about 4300 μm2 for a high voltage application. If the base current of Q1 may be neglected and $I_r = I_1$, by assuming: I1=30 μA, Is=–16 A, β1=β2=100, the current $I_2$ that is delivered by circuit will be equal to 1.28 nA, which is over 20,000 times less than $I_r$.

By assuming $I_r = I_1$ and considering negligible the base current of Q1, the expression (5) may be rewritten as:

$$I_2 = \frac{I_r^{\frac{3}{4}} I_s^{\frac{1}{4}}}{h_{FE}^{\frac{3}{4}}} \quad (6)$$

Substantially, starting from a reference current $I_r$, it is possible to derive a fractionary current $I_2$, in a ratio that may be of four orders of magnitude, while employing a limited number of transistors, all of minimum size, with a marked saving of integration area.

The fractionary current $I_2$, controlled by the voltage difference V1–V2, produced by the circuit of the invention, may be usefully employed for charging an integrated capacitance C, in order to produce on an output mode of the circuit ($V_{out} = V_1$), a voltage ramp.

The expression of the slope of the generated ramp may be obtained by dividing the expression (6) by the capacitance C, having assumed: $I_r = I_1$ and $dV_1/dt = dV_2/dt$. This derivation is justified by the fact that the voltage $V_1 - V_2$ is constant because a constant current flows through the transistors Q1, Q2 and Q3. Therefore the slope of the ramp will be given by:

$$\frac{dV_1}{dt} = \frac{I_2}{C} = \frac{I_r^{\frac{3}{4}} I_s^{\frac{1}{4}}}{C h_{FE}^{\frac{3}{4}}}$$

For a capacitance value of 10 pF and a reference current $I_r$ of about 10 μA, ramps with a slope of about 100 V/sec may be obtained.

It is evident that the circuit of the invention lends itself to implement a capacitance multiplier circuit, that is a ramp generator circuit having a relatively large time constant, which is useful in a large number of design situations.

The embodiment depicted in FIG. 2 essentially employs bipolar PNP transistors. Of course the circuit may also be implemented with bipolar NPN transistors.

In an embodiment as the one depicted in FIG. 2, employing PNP transistors, the leakage currents of the tubs wherein the transistors are formed and the substrate of the integrated circuit could introduce errors and jeopardize the correct functioning at high temperature.

Figure 3:
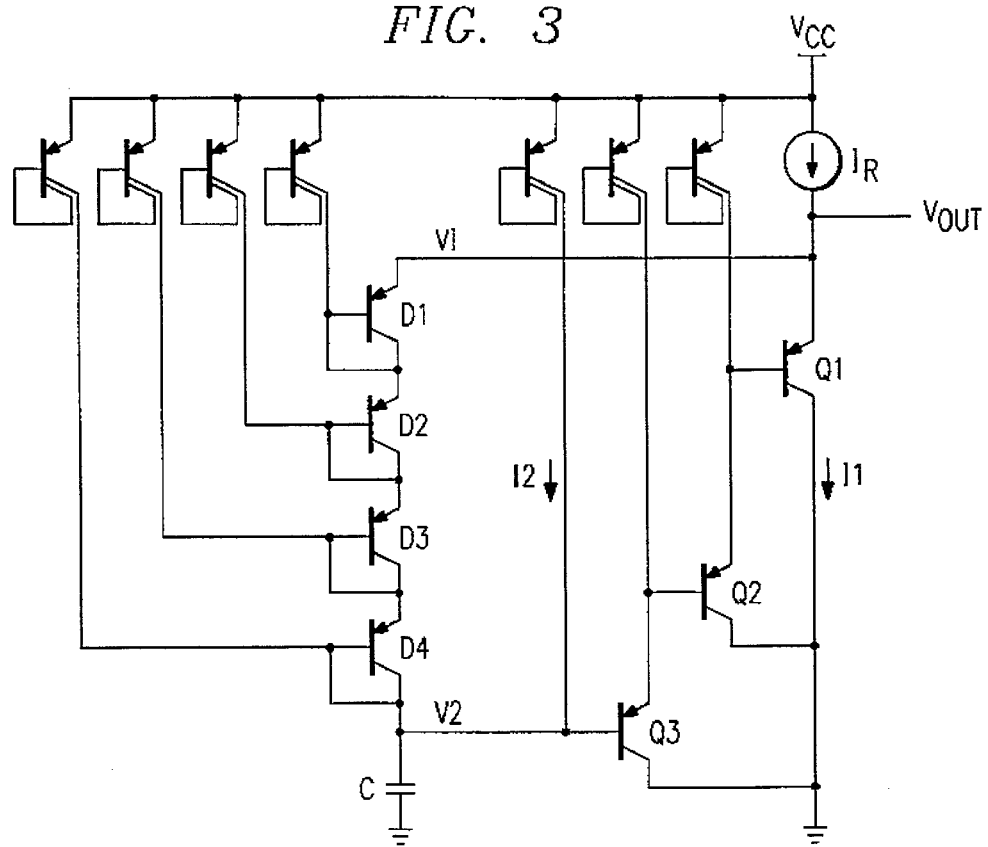
FIG. 3 shows the circuit of FIG. 2 provided with means for compensating leakage currents.

This occurrence may be prevented by implementing the circuit as shown in FIG. 3. The leakage of current of each tub may be effectively "recovered" (or compensated for) by employing an auxiliary PNP transistor, having a collector split in two parts. A first portion of the collector is short-circuited to the base to implement a diode configuration of the transistor, while the other portion of the collector injects in the tub of the transistor (that is in the base region thereof) a current that compensates the leakage current towards the substrate.

Of course, also these auxiliary transistors that maybe employed for compensating for the leakage current, may be transistors of minimum size, similar to the size of the other transistors that form the functional circuit.

Figure 4:
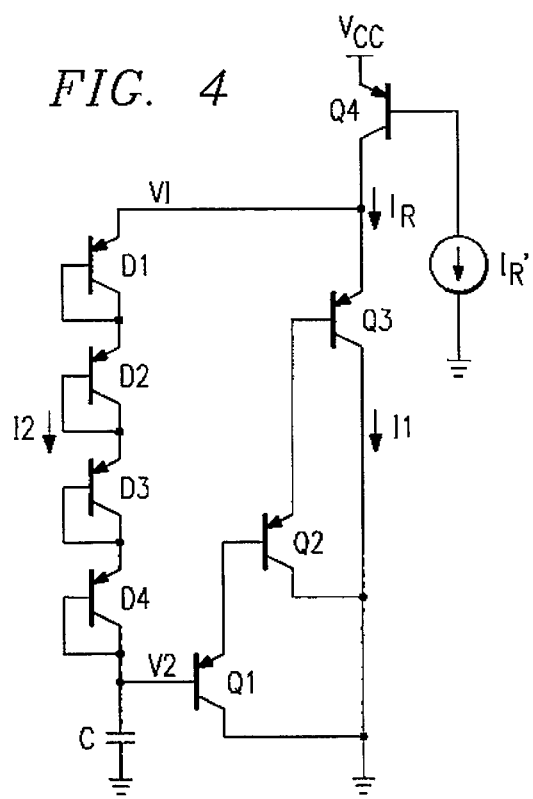
FIG. 4 shows a circuit made according to an alternative embodiment of the invention.

According to an alternative embodiment of the invention, in order to satisfy particular design requirements of the circuit, for example in order to ensure a ramp slope independent from the $h_{FE}$ parameters of the transistors used, the circuit may be implemented in an alternative form, as shown in FIG. 4.

The value of the charge current I2 that is delivered to the integrated capacitance C may be untied from a direct dependency from the current transfer ratio ($h_{FE}$) of the transistors in a common emitter configuration, by employing as a reference current $I_r$ a current that is purposely made dependent from the same parameters of the transistors $h_{FE}$. This is obtained by generating the reference current $I_r$ by means of a transistor Q4, driven through its space by a current generator $I_r$, which is independent of the current gain of the transistors. In this way it is possible to nullify the dependency of the slope of the generated voltage ramp from said intrinsic parameter of the transistors used.

With reference to the circuit of FIG. 4, it is possible to demonstrate that the slope of the ramp is given by:

$$\frac{dV_2}{dt} = \frac{I_2}{C} = \frac{I_r^{\frac{3}{4}} I_s^{\frac{1}{4}}}{C}$$

A particularly preferred embodiment of a generator of a current $I_r$, independent of the gain of transistors used, may be based on the use of a current generator that depends from the reverse junction current of the transistors used (substantially equivalent to the saturation current $I_s$ of the transistors). Moreover, the generator may also be designed in such a way as to compensate, in terms of temperature drift, the ramp generating circuit. A current generator that satisfies both these requirements is depicted in FIG. 5.

Figure 5:
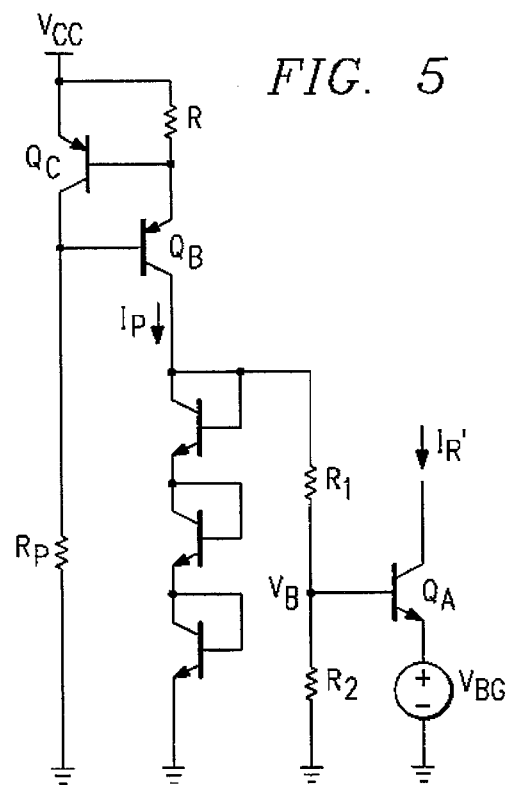
FIG. 5 shows an embodiment of a reference current generator employed in the circuit of FIG. 4.

The reference current generator $I_r$, of FIG. 5 is dependent on the reverse junction current (which is substantially equivalent to the saturation current Is), of the transistor $Q_A$ according to the following relationship:

$I_r = K I_s^{-1/3}$ where K is a constant.

Moreover, the current generator of FIG. 5 is made temperature dependent according to an exponential law. It may be shown that the exponential factor of dependency from temperature may be pre-established by fixing the ratio between the resistances R1 and R2.

In the embodiment shown in FIG. 4, an effective temperature compensation of the entire circuit is achieved by verifying the following condition:

$$\frac{R_1}{R_2} = \frac{5}{4}$$

Some other considerations which may be relevant in the circuits shown are as follows:

In the operation of the circuit of FIG. 2, with e.g. VCC=5 volts, the forward-biased junctions of transistors Q1, Q2, Q3 would quickly charge V2 and not turn on until Vout comes to 3 $V_{be}$'s above ground, and from that point up Q1 would turn on and the slow ramping would proceed as described. The slow ramping would stop when V2 comes up to within three $V_{be}$'s below VCC, plus whatever additional drop is introduced by the current source IR.

For practical timing circuits, a reset transistor would be used to initially discharge the capacitor until a timing cycle is desired.

With regard to the general formulation of the invention, that a number N of transistors is used together with a number N+K of diodes, the charging current would be even smaller if K is greater than 1. Having K=N would generally be undesirable, as tending to reduce head-room, but would reduce the base current of the last transistor (Q3 or equivalent) in the Darlington configuration.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

In addition to timing circuits and ramp generators, the ability to provide an extremely small scaled-down copy of a reference current could be useful in oscillators.

Simple circuit modifications can be made to reduce the effect of the base current of transistor Q3 if necessary, but would not generally be necessary In another embodiment, the circuits shown could be readily adapted to the dual NPN implementation.

As an alternative embodiment, the leakage-compensation auxiliary transistors added in FIG. 3 could be used on some but not all of the diode-connected transistors.

As another alternative embodiment, at least the diode-connected chain might be replaced by MOS transistors if desired.

As another alternative embodiment, it is possible that the complete circuit could be adapted to a MOS implementation, e.g. using subthreshold conduction in a chain of MOS diodes to supply the charging current.

What is claimed is:

1. A timing circuit, comprising:
   an integrating capacitance, having a first terminal connected to a first power supply voltage;
   a first string of bipolar transistors, connected in a Darlington configuration having an external base thereof connected to a second terminal of said capacitance, and having a first external current-carrying terminal thereof connected to said first power supply voltage, and having a second external current-carrying terminal thereof connected to an output voltage terminal;
   a second string of diode-connected bipolar transistors operatively connected between said first terminal and said output node, said second string including a larger number of bipolar transistor than said first string; and a current generator connected to provide a regulated current from a second power supply connection to said output node.

2. A circuit for dividing-down a reference current to produce a scaled-down copy thereof, comprising:

first and second power supply connections;

a connection for receiving a reference current;

a chain of N Darlington-connected bipolar transistors, where N is greater than one, having a first current-carrying terminal of a primary transistor thereof connected to a first node, a second current-carrying terminal of said primary transistor connected to said first power supply node; and having additional transistors, each having a first current-carrying terminal connected to drive a base terminal of another one of said transistors in said chain, and a second current-carrying terminal connected in common with second current-carrying of said primary transistor, wherein a last one of said Darlington-connected transistors has a base terminal thereof connected to a second node; and a string of diode connected transistors connected between said first and second nodes, said string of diode connected transistors comprising a greater number of transistors connected in series than are included in said Darlington configuration.

3. A circuit for dividing a reference current generated by a current generator, characterized by comprising an N number of transistors in a Darlington configuration, where N is greater than one, connected in cascade, between the said current generator and a fractionary current output node;

an N+k number, where k is an integer greater than zero, of series connected, directly biased diodes, connected between said generator and said fractionary current output node.

4. A circuit as defined in claim 3, wherein each diode is constituted by a diode configured transistor and all transistors composing the circuit have the minimum process size.

5. A circuit as defined in claim 3, wherein all transistors are bipolar PNP transistors.

6. A circuit as defined in claim 5, wherein said N PNP transistors are realized in separate tubs of a semiconducting substrate of an integrated circuit and wherein the leakage current of each tub, constituting a base region of the respective transistor, towards the substrate is compensated by means of an auxiliary PNP transistor.

7. A circuit as defined in claim 6, wherein each said leakage current compensating PNP transistor has a collector split in two parts, the first part being short-circuited with the base of the transistor, the other part of the collector being connected to the base of a relative PNP transistor and the emitter is connected to a supply rail of the circuit.

8. A circuit as defined in claim 3, wherein said current generator is a transistor driven through its base by a current generator having a predetermined dependency characteristic from one or more parameters to implement a compensation of drifts of said parameters.

9. A circuit as defined in claim 8, wherein said current generator generates a driving current proportional to the current transfer ratio of the transistors in a common emitter configuration.

10. A circuit as defined in claim 8, wherein the said generator generates a driving current dependent according to an exponential law relationship from the temperature of operation.

11. A ramp generating circuit with a relatively long time constant, monolithically integratable, which comprises at least a reference current generator, an integrated capacitor and means for dividing the reference current to charge said integrated capacitor with a fractionary current of said reference current, characterized by comprising an N number of transistors in a Darlington configuration, where N is greater than one, connected in cascade, between the said current generator and a fractionary current output node;

an N+k number, where k is an integer greater than zero, of series connected, directly biased diodes, connected between said generator and said fractionary current output node.

12. A circuit as defined in claim 11, wherein each diode is constituted by a diode configured transistor and all transistors composing the circuit have the minimum process size.

13. Circuit as defined in claim 11, wherein all transistors are bipolar PNP transistors.

14. A circuit as defined in claim 13, wherein said N PNP transistors are realized in separate tubs of a semiconducting substrate of an integrated circuit and wherein the leakage current of each tub, constituting a base region of the respective transistor, towards the substrate is compensated by means of an auxiliary PNP transistor.

15. A circuit as defined in claim 14, wherein each said leakage current compensating PNP transistor has a collector split in two parts, the first part being short-circuited with the base of the transistor, the other part of the collector being connected to the base of a relative PNP transistor and the emitter is connected to a supply rail of the circuit.

16. A circuit as defined in claim 11, wherein said current generator is a transistor driven through its base by a current generator having a predetermined dependency characteristic from one or more parameters to implement a compensation of drifts of said parameters.

17. A circuit as defined in claim 16, wherein said current generator generates a driving current proportional to the current transfer ratio of the transistors in a common emitter configuration.

18. A circuit as defined in claim 16, wherein said generator generates a driving current dependent according to an exponential law relationship from the temperature of operation.

19. A capacitance multiplier circuit comprising at least a ramp generating circuit with a relatively longtime constant, monolithically integratable, which comprises at least a reference current generator, an integrated capacitor and means for dividing the reference current to charge said integrated capacitor with a fractionary current of said reference current, characterized by comprising an N number of transistors in a Darlington configuration, where N is greater than one, connected in cascade, between the said current generator and a fractionary current output node;

an N+k number, where k is an integer greater than zero, of series connected, directly biased diodes, connected between said generator and said fractionary current output node.

20. A circuit as defined in claim 19, wherein each diode is constituted by a diode configured transistor and all transistors composing the circuit have the minimum process size.

21. A circuit as defined in claim 19, wherein all transistors are bipolar PNP transistors.

22. A circuit as defined in claim 21, wherein said N PNP transistors are realized in separate tubs of a semiconducting substrate of an integrated circuit and wherein the leakage current of each tub, constituting a base region of the respective transistor, towards the substrate is compensated by means of an auxiliary PNP transistor.

23. A circuit as defined in claim 22, wherein each leakage current compensating PNP transistor has a collector split in two parts, the first part being short-circuited with the base of the transistor, the other part of the collector being connected to the base of a relative PNP transistor and the emitter is connected to a supply rail of the circuit.

24. A circuit as defined in claim 19, wherein said current generator is a transistor driven through its base by a current generator having a predetermined dependency characteristic from one or more parameters to implement a compensation of drifts of said parameters.

25. A circuit as defined in claim 24, wherein said current generator generates a driving current proportional to the current transfer ratio of the transistors in a common emitter configuration.

26. A circuit as defined in claim 24, wherein the said generator generates a driving current dependent according to an exponential relationship from the temperature of operation.

27. A method for producing a ramp voltage comprising the steps of:

producing a reference current at an output node;

providing N directly biased Darlington-configured transistors between said output node and an integrated capacitance, where N is greater than 1; and providing a string of N+k junctions between said output node and said integrated capacitance;

wherein a slow ramp voltage is produced at said output node.

28. The method of claim 27, wherein each said junction is constituted by a diode configured transistor.

29. The method of claim 27, further comprising the step of providing a compensating current to each of said transistors to compensate for a leakage current of said transistor.

30. The method of claim 28, further comprising the step of providing a compensating current to each of said transistors to compensate for a leakage current of said transistor.

31. The method of claim 27, wherein further comprising the step of varying said reference current according to an exponential law relationship from the temperature of operation.

32. A circuit for dividing-down a reference current to produce a scaled-down copy thereof, comprising:

first and second power supply connections;

a connection for receiving a reference current;

a first circuit branch of N transistors in a cascade configuration, where N is greater than one, having a first current-carrying terminal of a primary transistor thereof connected to a first node, a second current-carrying terminal of said primary transistor connected to said first power supply node; and having additional transistors, each having a first current-carrying terminal connected to drive a control terminal of another one of said transistors in said first circuit branch, and a second current-carrying terminal connected in common with second current-carrying of said primary transistor, wherein a last one of said transistors has a control terminal thereof connected to a second node; and a second circuit branch of transistors connected in series between said first and second nodes, each said transistor having a control terminal connected to a current carrying terminal of said transistor, said string of MOS transistors comprising a greater number of transistors connected in series than are included in said first circuit branch.

* * * * *

UNITED STATES PATENT AND TRADEMARK OFFICE
CERTIFICATE OF CORRECTION

PATENT NO. : 5,585,752

DATED : December 17, 1996

INVENTOR(S) : Edoardo Botti; Giorgio Chiozzi

It is certified that error appears in the above-identified patent and that said Letters Patent is hereby corrected as shown below:

In column 10, claim 32, line 31 delete the word "MOS"

Signed and Sealed this

Twenty-third Day of December, 1997

Attest:

BRUCE LEHMAN

Attesting Officer     Commissioner of Patents and Trademarks